United States Patent
Koch et al.

(10) Patent No.: US 10,712,418 B2
(45) Date of Patent: Jul. 14, 2020

(54) SYSTEMS AND METHODS FOR DIFFUSION-WEIGHTED MULTI-SPECTRAL MAGNETIC RESONANCE IMAGING

(71) Applicant: THE MEDICAL COLLEGE OF WISCONSIN, INC., Milwaukee, WI (US)

(72) Inventors: Kevin M. Koch, Wauwatosa, WI (US); Lutfi Tugan Muftuler, Menomonee Falls, WI (US)

(73) Assignee: The Medical College of Wisconsin, Inc., Milwaukee, WI (US)

( * ) Notice: Subject to any disclaimer, the term of this patent is extended or adjusted under 35 U.S.C. 154(b) by 168 days.

(21) Appl. No.: 15/574,287

(22) PCT Filed: May 13, 2016

(86) PCT No.: PCT/US2016/032389
§ 371 (c)(1),
(2) Date: Nov. 15, 2017

(87) PCT Pub. No.: WO2016/187015
PCT Pub. Date: Nov. 24, 2016

(65) Prior Publication Data
US 2018/0136297 A1    May 17, 2018

Related U.S. Application Data (60) Provisional application No. 62/162,003, filed on May 15, 2015.

(51) Int. Cl.
*G01R 33/563* (2006.01)
*G01R 33/565* (2006.01)
(Continued)

(52) U.S. Cl.
CPC ... *G01R 33/56341* (2013.01); *G01R 33/4824* (2013.01); *G01R 33/56536* (2013.01);
(Continued)

(58) Field of Classification Search
CPC .......... G01R 33/56341; G01R 33/4824; G01R 33/56536; G01R 33/4835; G01R 33/5617;
(Continued)

(56) References Cited

U.S. PATENT DOCUMENTS 6,265,873 B1    7/2001  Le Roux
7,239,140 B1*   7/2007  Maier .............. G01R 33/56341
                                                            324/309
(Continued)

FOREIGN PATENT DOCUMENTS

EP        2500742 A1      9/2012
WO    2014/037870 A1      3/2014
(Continued)

OTHER PUBLICATIONS

Pipe, J.G., Farthing, V.G. and Forbes, K.P., 2002. Multishot diffusion-weighted FSE using Propeller MRI. Magnetic Resonance in Medicine: An Official Journal of the International Society for Magnetic Resonance in Medicine, 47(1), pp. 42-52. (Year: 2002).*

(Continued)

*Primary Examiner* — Christopher P McAndrew
(74) *Attorney, Agent, or Firm* — Quarles & Brady LLP (57) ABSTRACT

Systems and methods for performing diffusion-weighted multi-spectral imaging ("MSI") with a magnetic resonance imaging ("MRI") system are provided, Diffusion-weighted images can thus be acquired from a subject in which a metallic object, such as an implant or other device, is present. In general, a two-dimensional or three-dimensional diffusion-weighted PROPELLER acquisition is performed to acquire data from multiple different spectral bins. Images (Continued)

from the spectral bins are reconstructed and combined to form diffusion-weighted composite images. Non-CPMG phase-cycling and split-blade PROPELLER techniques are combined with PROPELLER MSI metal artifact mitigation principles to this end.

13 Claims, 4 Drawing Sheets

(51) Int. Cl.
*G01R 33/48* (2006.01)
*G01R 33/483* (2006.01)
*G01R 33/561* (2006.01)
*G01V 3/14* (2006.01)

(52) U.S. Cl.
CPC .......... *G01V 3/14* (2013.01); *G01R 33/4835* (2013.01); *G01R 33/5617* (2013.01); *G01R 33/56509* (2013.01); *G01R 33/56545* (2013.01)

(58) Field of Classification Search
CPC ........ G01R 33/56509; G01R 33/56545; G01V 3/14
USPC ........................................................ 324/309
See application file for complete search history.

(56) References Cited

U.S. PATENT DOCUMENTS

| | | | |
|---|---|---|---|
| 7,821,264 B2 | 10/2010 | Koch et al. | |
| 7,928,729 B2 | 4/2011 | Hargreaves et al. | |
| 8,154,293 B2 | 4/2012 | Li et al. | |
| 8,482,279 B2 | 7/2013 | Chen et al. | |
| 2003/0214289 A1 | 11/2003 | Van Muiswinkel et al. | |
| 2005/0127912 A1* | 6/2005 | Pipe ................. | G01R 33/56341 324/309 |
| 2008/0009701 A1 | 1/2008 | Avram et al. | |
| 2010/0308827 A1 | 12/2010 | Koch et al. | |
| 2011/0025325 A1 | 2/2011 | Li et al. | |
| 2011/0241671 A1 | 10/2011 | Zhao et al. | |
| 2013/0076356 A1 | 3/2013 | Jellus et al. | |
| 2016/0231409 A1* | 8/2016 | Taviani .............. | G01R 33/5611 |
| 2016/0341808 A1* | 11/2016 | Zhang ................. | G01R 33/483 |

FOREIGN PATENT DOCUMENTS

| | | |
|---|---|---|
| WO | 2014037870 A1 | 3/2014 |
| WO | 2014115043 A1 | 7/2014 |

OTHER PUBLICATIONS

Takahara, T., Imai, Y., Yamashita, T., Yasuda, S., Nasu, S. and Van Cauteren, M., 2004. Diffusion weighted whole body imaging with background body signal suppression (DWIBS): technical improvement using free breathing, STIR and high resolution 3D display. Matrix, 160(160), p. 160. (Year: 2004).*
The International Search Report and Written Opinion for International Patent Application No. PCT/US2016/032389 dated Aug. 18, 2016.
Extended European Search Report issued in corresponding European Application No. EP16797011.0, dated Nov. 27, 2018, 6 pages.
Aksoy, Murat et al. "Effects of motion and b-matrix correction for high resolution DTI with short-axis Propeller-EPI" NMR in Biomedicine, vol. 23, No. 7, Mar. 11, 2010, pp. 794-802, XP055309714, GB, ISSN: 0952-3480, DOI: 10.1002/nbm.1490.
Hargreaves, Brian A et al. "Fast 2D Imaging for Distortion Correction Near Metal Implants" (Stanford University). Abstract #615. Joint Annual Meeting ISMRM-ESMRMB 2014, 1 page.
Kaushik, Suryanarayanan Sivaram et al. "Clinically Viable Diffusion-Weighted Imaging Near Metal using 2D-MSI Propeller Duo" Proceedings of the International Society for Magnetic Resonance in Medicine, 24th Annual Meeting and Exhibition, Singapore, May 7-13, 2016, vol. 24, Apr. 22, 2016, p. 370, XP040681413.
Koch, Kevin M. et al. "A multispectral three-dimensional acquisition technique for imaging near metal implants" (GE Healthcare, Applied Science Laboratory); Magnetic Resonance in Medicine 61, 381-390, Feb. 2009.
Koch, K. M. et al. "Imaging near metal with a MAVRIC-SEMAC hybrid" Magnetic Resonance in Medicine 65, 71-82, Jan. 2011.
Koch et al, "Imaging Near Metal: The Impact of Extreme Static Local Field Gradients on Frequency Encoding Processes" Magnetic Resonance in Medicine 71:2024-2034 (2014).
Koch, Kevin M et al, "Non-CPMG Multi-Spectral Propeller for Diffusion-Weighted Imaging Near Metal Implants" Proceedings of the International Society for Magnetic Resonance in Medicine, 23th Annual Meeting and Exhibition, Tronto, Canada, May 30-Jun. 5, 2015, vol. 23, May 15, 2015, p. 106, XP040665789.
Lu, Lan et al. "Diffusion-Prepared Fast Imaging with Steady-State Free Precession (DP-FISP): A Rapid Diffusion MRI Technique at 7T," Magnetic Resonance in Medicine, vol. 68, No. 3, 2012: pp. 868-873.
Lu, Wenmiao et al. "SEMAC: Slice Encoding for Metal Artifact Correction in MRI" Magn Reson Med. Jul. 2009; 62: pp. 66-76.
Norris et al, "On the application of ultra-fast rare experiments" MRM, 27:142-164, 1992.
Pipe, James G. et al. "Multishot diffusion-weighted FSE using Propeller MRI" Magnetic Resonance in Medicine 47:42-52, (2002).
Pipe, JG. "Motion correction with Propeller MRI: application to head motion and free-breathing cardiac imaging" Magn Reson Med. 42:963-9 (1999).

* cited by examiner

— SPIN ECHO
----- STIMULATED ECHO

SYSTEMS AND METHODS FOR DIFFUSION-WEIGHTED MULTI-SPECTRAL MAGNETIC RESONANCE IMAGING

CROSS-REFERENCE TO RELATED APPLICATIONS

This application represents the national stage entry of PCT International Application No. PCT/US2016/032389 filed on May 13, 2016, which claims the benefit of U.S. Provisional Patent Application Ser. No. 62/162,003, filed on May 15, 2015, and entitled "SYSTEMS AND METHODS FOR DIFFUSION-WEIGHTED MULTI-SPECTRAL MAGNETIC RESONANCE IMAGING," both of which are herein incorporated by reference in their entirety.

BACKGROUND OF THE INVENTION

The field of the invention is systems and methods for magnetic resonance imaging ("MRI"). More particularly, the invention relates to systems and methods for diffusion-weighted MRI near metallic implants or devices.

Diffusion-weighted imaging ("DWI") is an MRI method for imaging certain brain and spinal cord pathologies, such as infarction (e.g., brain cell death) caused by ischemic stroke; nerve demyelination; and cytotoxic edema. Currently, DWI MRI relies on echo planar imaging ("EPI") pulse sequences to induce proton magnetization in tissue water molecules as part of the imaging process. However, imaging with EPI pulse sequence is highly susceptible to the effects of metallic implants or devices in the subject. As a result, the acquired images are often unrecognizable due to image distortions caused by metallic object-induced magnetic field perturbations.

To overcome the problem of the distortions caused by metallic implants or devices, multi-spectral imaging ("MSI") was developed. In general, MSI combines multiple MRI magnetic source measurements into a single set that is used to construct an undistorted image. MSI techniques have been successful in improving imaging of tissues near metal implants; however, these techniques are based on fast spin echo ("FSE") imaging and are therefore not inherently supportive of diffusion-weighting. In particular, the addition of diffusion lobes to an FSE sequence violates the CPMG condition, resulting in a rapid decay of the amplitude of the echo train. Additionally, FSE sequences do not solve the problem of obtaining high quality DWI images of brain, spinal cord, and other tissues if metal implants are present.

There remains a need then for the ability to perform diffusion-weighted MRI in regions near metallic objects, such as metallic implants or other devices.

SUMMARY OF THE INVENTION

The present invention overcomes the aforementioned drawbacks by providing a method for using a magnetic resonance imaging ("MRI") system to produce a diffusion-weighted image of a subject in which a metallic object is present. Diffusion-weighted data are acquired from the subject using the MRI system to sample k-space at a number of different k-space blades for each of a number of different spectral bins. In two-dimensional implementations, data are acquired in this manner over a number of different slice locations. Combined data are produced for each spectral bin by combining the diffusion-weighted data acquired for each of the number of different k-space blades for each spectral bin. In two-dimensional implementations, this process is repeated for each slice location. An image is then reconstructed for each spectral bin from the combined data produced for the associated spectral bin. In two-dimensional implementations, this process is done for each slice location. A diffusion-weighted composite image is then produced by combining these reconstructed spectral bin images. For two-dimensional implementations, the combination is done for spectral bin images reconstructed for the same slice location.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for performing diffusion-weighted multi-spectral imaging ("MSI") with a magnetic resonance imaging ("MRI") system. These systems and methods thus allow for diffusion-weighted images to be acquired from a subject in which a metallic object, such as an implant or other device, is present.

The systems and methods described here can be implemented for many different clinical applications. As one non-limiting example, the systems and methods can provide quantitative diffusion-weighted assessment of spinal cord health in the immediate vicinity of spinal fusion devices or disc replacements.

The techniques described here provide the ability to perform motion-insensitive and diffusion-weighted imaging near metal implants through a fusion of the 3D-MSI and PROPELLER principles. The technique is applicable to 2D and 3D-MSI approaches. In some examples, diffusion weighting is added through the use of non-CPMG phase-modulated compensation and split-blade PROPELLER approaches, combined with PROPELLER MSI metal artifact mitigation principles. In some other examples, diffusion weighting is added through the use of an appropriate diffusion preparation module, such as those described by L. Lu, et al., in "Diffusion-Prepared Fast Imaging with Steady-State Free Precession (DP-FISP): A Rapid Diffusion MRI Technique at 7T," *Magn Reson Med.*, 2012; 68(3):868-873.

The non-CPMG artifacts caused by adding diffusion lobes to a fast spin-echo ("FSE") train can also be mitigated by splitting the contributions made by the spin echoes and the stimulated echoes (e.g., by using a so-called DUO acquisition scheme). As one example, a 2D-MSI sequence can be adapted to implement a PROPELLER-DUO sequence to obtain clinically-feasible, artifact-minimized, diffusion-weighted images in regions-of-interest that are in close proximity to metallic implants or devices in a subject.

Diffusion-weighted MRI has been shown to be a potential biomarker of spinal cord health. Assessing spinal cord health after surgical implantation of devices is an important clinical task. In the case of post-surgical assessments of the spinal cord near indwelling metallic objects, it is contemplated that the systems and methods described here will provide significant benefit to clinicians by allowing reliable post-surgical assessments to be made.

Figure 1:
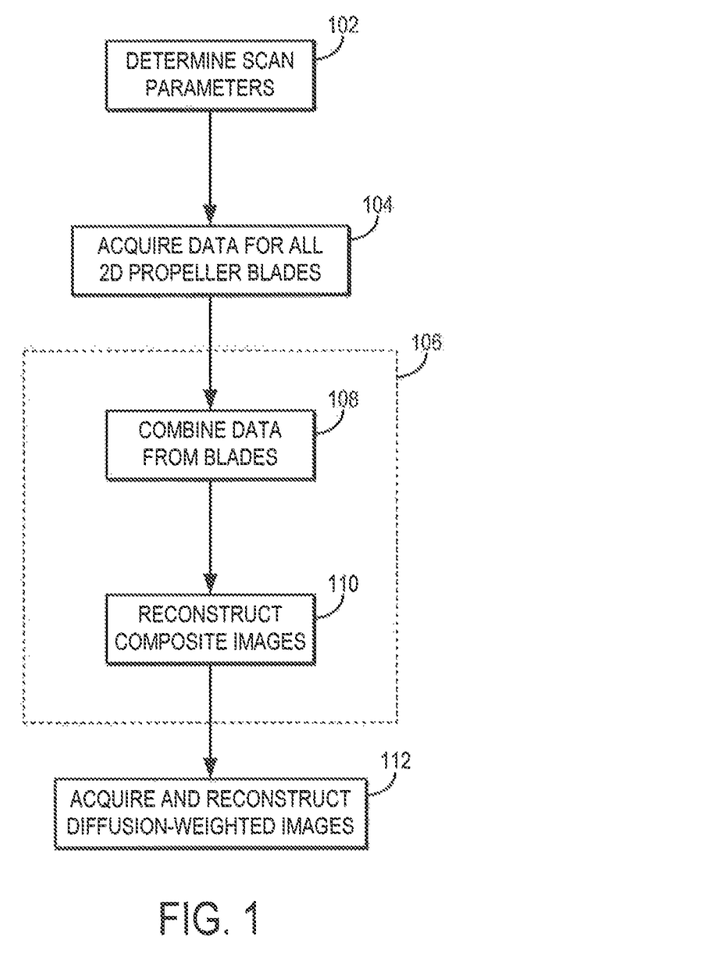
FIG. 1 is a flowchart setting forth the steps of an example method for two-dimensional, multi-spectral, diffusion-weighted imaging.

Referring now to FIG. 1, a flowchart is illustrated as setting forth the steps of an example method for performing a two-dimensional diffusion-weighted MSI acquisition and image reconstruction.

Based on the geometric prescription and on information about the metallic implant or device, such as a previous image of the implant or device, scan parameters are determined, as indicated at step 102. In general, the scan parameters can include the number of 2D PROPELLER blades, the number of spectral bins, and the number of slices to be imaged. In accordance with these scan parameters, data are acquired for all PROPELLER blades and for all slices, as indicated at step 104. In some examples, the slices may be acquired in an interleaved fashion. Likewise, the spectral bins can be sampled in an interleaved fashion. In some examples, parallel imaging, multi-band imaging, or both can be integrated into the 2D PROPELLER MSI acquisition and reconstruction schemes to increase the achievable volume coverage of the imaging technique while keeping the overall scan time practical for clinical applications.

A 2D-MSI slice-selective polarity reversal technique can be used during the data acquisition step. For example, the bandwidths and selective-gradient amplitudes of the excitation and refocusing pulses can be matched and the sign of the excitation selection gradient inverted to allow "inner-volume" excitation of spatially and spectrally limited regions with high receiver bandwidth.

Images are then reconstructed from the acquired data, as generally indicated at process block 106. For image reconstruction, data from the blades are first combined, as indicated at step 108. During the combination, phase correction and motion correction techniques can be applied, Independently, for each slice and each spectral bin. Images are then reconstructed for each spectral bin and combined for each slice to form composite images, as indicated at step 110.

Using the steps described above for 2D PROPELLER MSI, diffusion-weighted images are next acquired, as indicated at step 112. These diffusion-weighted images are acquired using the same technique described in steps 104-110; however, diffusion-preparation pulses are applied during the data acquisition step. As one example, the diffusion-preparation pulses can be applied between the first 90 and 180 pulses and the first 180 pulse and the first echo readout.

In some examples, during the data acquisition step, a phase modulation scheme can be used to stabilize even and odd echoes. For example, a non-CPMG echo stabilization can be performed through alternating X-Y RF refocusing pulse phase modulation across the PROPELLER echo trains. Even and odd echoes can also be placed into orthogonal bins in a "split-blade" formation, which allows the inherent phase-correction steps in PROPELLER processing (e.g., those performed in step 108 above) to correct for any residual phase variations between the odd and even echoes. In some other examples, during the data acquisition step, the echo train stability can also be stabilized by separating spin echoes and stimulated echoes. The spin echoes and stimulated echoes can be separated using a PROPELLER-DUO acquisition scheme, such as the one illustrated in the pulse sequence shown in FIG. 2. Image reconstruction is then performed as outlined above to create diffusion-weighted images.

Figure 2:
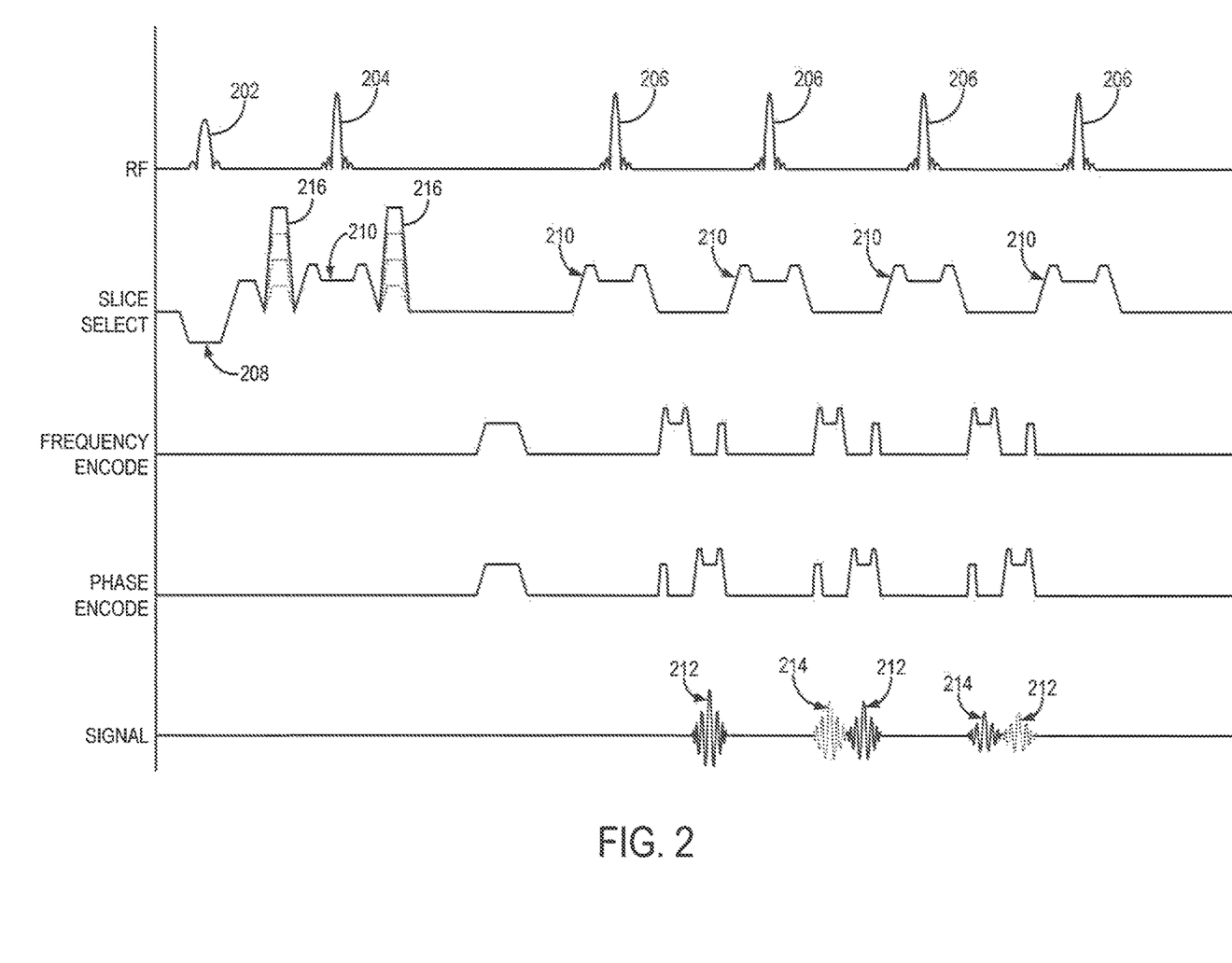
FIG. 2 is a pulse sequence for an example 2D-MSI imaging technique implementing a PROPELLER-DUO acquisition to separate spin echoes and stimulated echoes, and in which alternating echoes are split into orthogonal k-space blades.

The PROPELLER-DUO sequence shown in FIG. 2 performs MSI metal artifact imaging by dynamically changing the transmit and receive frequencies of the RF pulses 202, 204, 206 to sample multiple spectral-bins. The amplitude of the slice-select gradient 208 is flipped relative to the refocusing gradients 210 to excite spatially and spectrally selective bins. Based on the asymmetrical timing of the refocusing pulses 204, 206, an echo train is formed as containing alternating spin echoes 212 and stimulated echoes 214. Diffusion weighting is achieved using diffusion-weighting gradients 216 around the first refocusing pulse 204.

Figure 3:
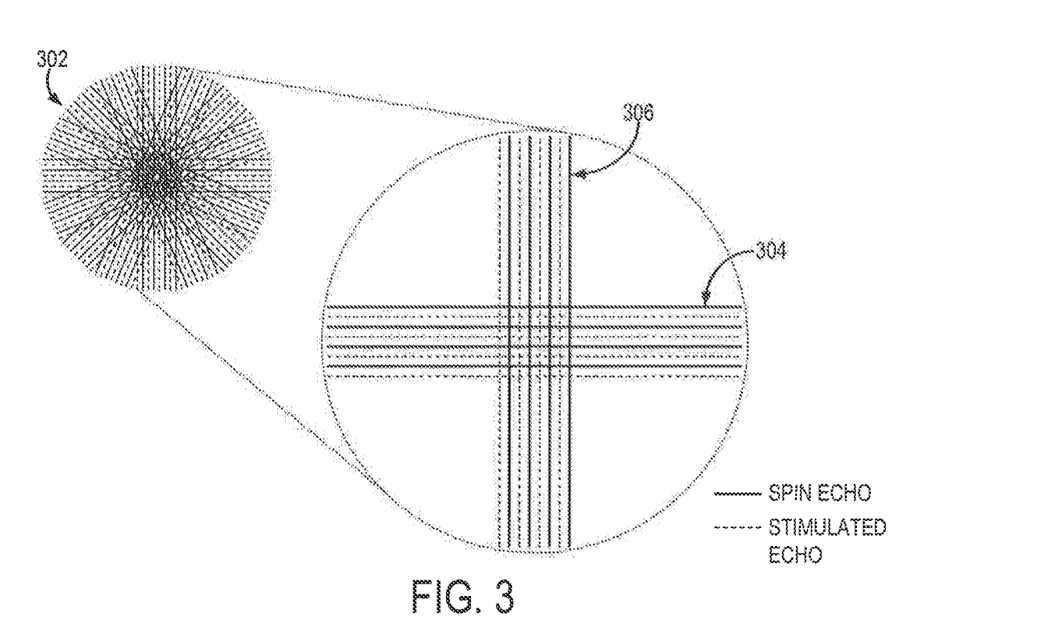
FIG. 3 is an example k-space sampling provided by the pulse sequence of FIG. 2, in which odd echoes and even echoes are split into orthogonal k-space blades.

To enable additional phase correction of odd and even echoes within the echo train, alternating echoes can be split into orthogonal blades. As shown in FIG. 3, a set of k-space blades 302 acquired using the pulse sequence described above includes pairs of orthogonal blades 304, 306 that are rotated through different angles about the center of k-space. Odd echoes are sampled in the blade 304 and even echoes are sampled in blade 306. As shown, each blade 304, 306 samples both spin echoes (solid lines) and stimulated echoes (dashed lines).

Figure 4:
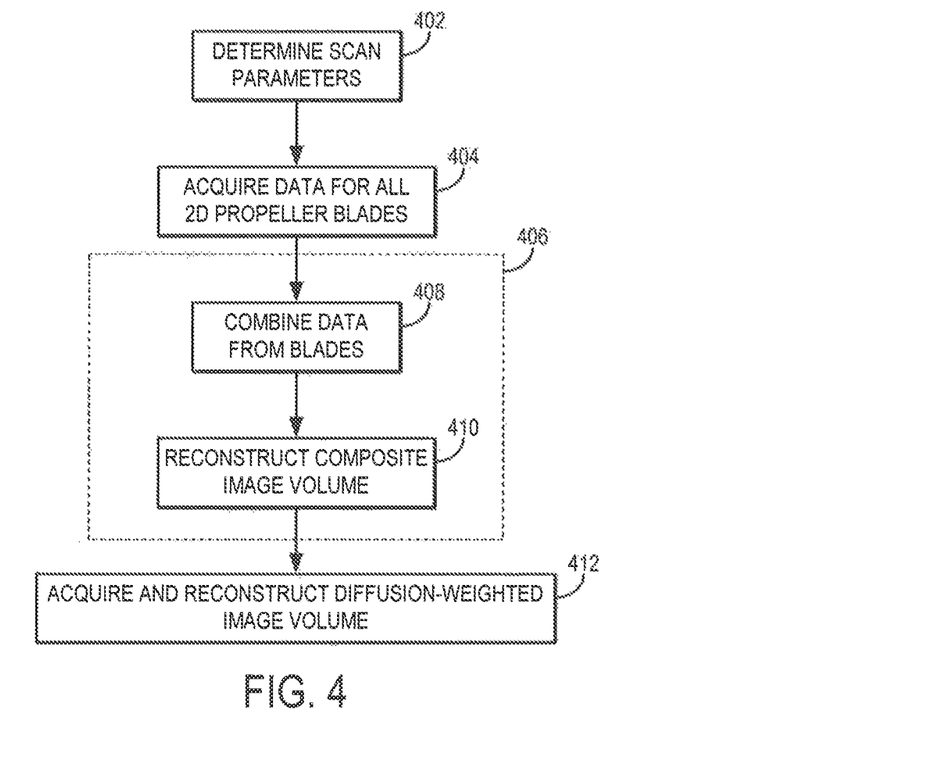
FIG. 4 is a flowchart setting forth the steps of an example method for three-dimensional, multi-spectral, diffusion-weighted imaging.

Referring now to FIG. 4, a flowchart is illustrated as setting forth the steps of an example method for performing a three-dimensional diffusion-weighted MSI acquisition and image reconstruction. In general, the 3D PROPELLER MSI acquisition and image reconstruction is similar to the 2D PROPELLER MSI scheme described above.

Based on the geometric prescription and on information about the metallic implant or device, such as a previous image of the implant or device, scan parameters are determined, as indicated at step 402. In general, the scan parameters can include the number of 3D PROPELLER blades and the number of spectral bins. In accordance with these scan parameters, data are acquired for all PROPELLER blades and spectral bins, as indicated at step 404. In some examples, the spectral bins are sampled in an interleaved fashion.

Images are then reconstructed from the acquired data, as generally indicated at process block 406. For image reconstruction, data from the blades are first combined, as indicated at step 408. During the combination, phase correction and motion correction techniques can be applied, independently, for each spectral bin. Images are then reconstructed for each spectral bin and combined to form a composite image volume, as indicated at step 410.

Using the steps described above for 3D PROPELLER MSI, diffusion-weighted images are next acquired, as indicated at step 412. These diffusion-weighted images are acquired using the same technique described in steps 404-410; however, diffusion-preparation pulses are applied during the data acquisition step. As one example, a diffusion preparation module can be implemented to achieve the desired diffusion weighting. As another example, the diffusion-preparation pulses can be applied between the first 90 and 180 pulses and the first 180 pulse and the first echo readout.

In the data acquisition step, a phase modulation scheme can also be used to stabilize even and odd echoes. For example, a non-CPMG echo stabilization can be performed through alternating X-Y RF refocusing pulse phase modulation across the PROPELLER echo trains. Even and odd echoes can also be placed into orthogonal bins in a "split-blade" formation, which allows the inherent phase-correction steps in PROPELLER processing (e.g., those performed in step 408 above) to correct for any residual phase variations between the odd and even echoes. Likewise, the echo train stability can also be improved using a split-echo acquisition to separate spin echoes and stimulated echoes, as described above. As one example, the split-echo acquisition can include a PROPELLER-DUO acquisition. Image reconstruction is then performed as outlined above to create diffusion-weighted images.

Thus, the systems and methods described here provide diffusion-weighting imaging near metal implants through the combination of non-CMPG FSE methods, PROPELLER imaging, and MSI artifact reduction principles. In general, the systems and methods described here combine elements of 2D-MSI and 3D-MSI techniques for metal artifact reduction, PROPELLER acquisition schemes for non-Cartesian fast-spin-echo MRI, diffusion-encoding, and techniques for improving the stability of the echo train formed in the data acquisition. As one example, the echo train stability can be improved using non-CPMG fast-spin-echo correction technologies. As another example, the echo train stability can be improved using a split-echo acquisition, such as a PROPELLER-DUO acquisition, in which spin echoes and stimulated echoes are separated. The resulting acquisition techniques can produce high quality, diffusion-weighted images in the near vicinity of metallic objects.

Figure 5:
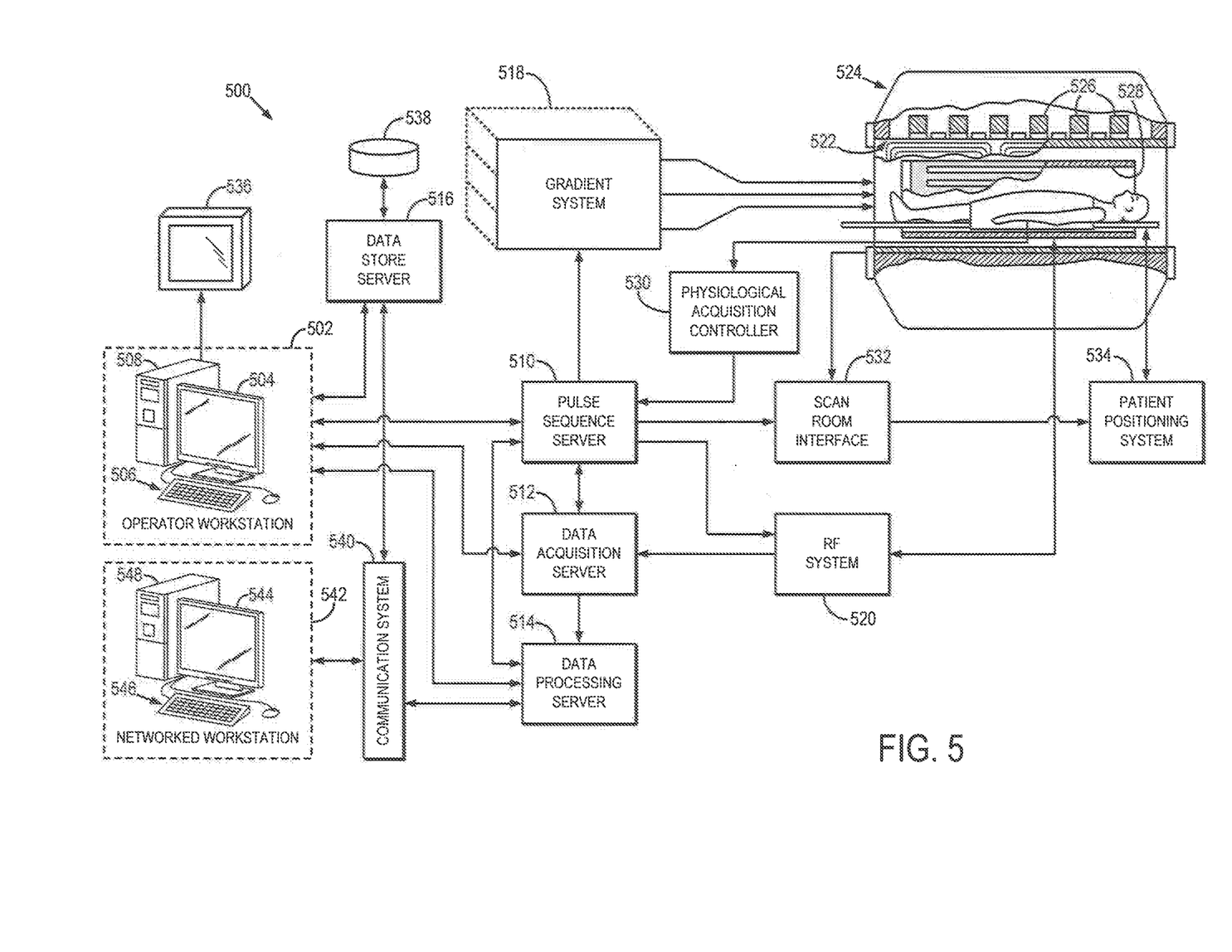
FIG. 5 is a block diagram of an example of a magnetic resonance imaging ("MRI") system.

Referring particularly now to FIG. 5, an example of a magnetic resonance imaging ("MRI") system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in a gradient coil assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 510 may receive patient data from a physiological acquisition controller 530. By way of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processing server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or in a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for using a magnetic resonance imaging (MRI) system to produce a diffusion-weighted image of a subject in which a metallic object is present, the steps of the method comprising:
   (a) acquiring diffusion-weighted data from the subject using the MRI system to sample k-space at a number of different k-space blades for each of a number of different spectral bins;
   (b) producing combined data for each spectral bin with a computer system by combining the diffusion-weighted data acquired for each of the number of different k-space blades for each spectral bin;
   (c) reconstructing with the computer system, an image for each spectral bin from the combined data produced for each associated spectral bin; and
   (d) producing a diffusion-weighted composite image with the computer system by combining the images reconstructed in step (c).

2. The method as recited in claim 1, wherein the diffusion-weighted data are acquired by sampling k-space at the number of different k-space blades for each of a number of different slice locations.

3. The method as recited in claim 2, wherein steps (b)(d) are repeated for each slice location to produce a diffusion-weighted composite image for each slice location.

4. The method as recited in claim 2, wherein step (a) includes acquiring the diffusion-weighted data using a pulse sequence in which bandwidths and slice-selective gradient amplitudes of radio frequency (RF) excitation and refocusing pulses are matched, and in which a polarity of an RF excitation slice-selective gradient is inverted.

5. The method as recited in claim 1, wherein step (b) includes applying with the computer system, phase corrections and motion corrections to the diffusion-weighted data while the diffusion-weighted data acquired for each of the number of different k-space blades for each spectral bin are combined.

6. The method as recited in claim 1, wherein step (a) includes acquiring the diffusion-weighted data using a non-CMPG echo stabilization by alternating radio frequency (RF) refocusing pulse phase modulation across an echo train sampled while acquiring data for each k-space blade.

7. The method as recited in claim 1, wherein step (a) includes acquiring the diffusion-weighted data such that data from even echoes and odd echoes are placed into orthogonal bins in a split-blade formation.

8. The method as recited in claim 1, wherein the images reconstructed in step (c) are three-dimensional image volumes and the diffusion-weighted composite image produced in step (d) is a three-dimensional diffusion-weighted composite image volume.

9. The method as recited in claim 1, wherein step (a) includes applying a diffusion preparation module before a first radio frequency (RF) excitation pulse.

10. The method as recited in claim 9, wherein step (a) includes acquiring the diffusion-weighted data using a fast-spin-echo train set of acquisitions.

11. The method as recited in claim 1, wherein step (a) includes acquiring the diffusion-weighted data using a split-echo acquisition that generates an echo train in which spin echoes and stimulated echoes are separated.

12. The method as recited in claim 11, wherein alternating echoes in the echo train are split into orthogonal k-space blades.

13. A method for using a magnetic resonance imaging (MRI) system to produce a diffusion-weighted image of a subject in which a metallic object is present, the steps of the method comprising:
   (a) acquiring diffusion-weighted data from the subject using the MRI system to sample k-space at a number of different k-space blades for each of a number of different spectral bins;
   (b) producing combined data for each spectral bin with a computer system by combining the diffusion-weighted data acquired for each of the number of different k-space blades for each spectral bin;
   (c) reconstructing with the computer system, an image for each spectral bin from the combined data produced for each associated spectral bin; and (d) producing a diffusion-weighted composite image with the computer system by combining the images reconstructed in step (c);

wherein step (a) includes applying a first diffusion-preparation pulse after a radio frequency (RF) excitation pulse and before a first RF refocusing pulse, and applying a second diffusion-preparation pulse after the first RF refocusing pulse and before a first echo readout.

\* \* \* \* \*